United States Patent
Hatanaka

(10) Patent No.: US 12,218,636 B2
(45) Date of Patent: Feb. 4, 2025

(54) DOHERTY AMPLIFIER

(71) Applicant: Mitsubishi Electric Corporation, Tokyo (JP)

(72) Inventor: Shohei Hatanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 570 days.

(21) Appl. No.: 17/595,556

(22) PCT Filed: Oct. 2, 2019

(86) PCT No.: PCT/JP2019/038906
§ 371 (c)(1),
(2) Date: Nov. 18, 2021

(87) PCT Pub. No.: WO2021/064892
PCT Pub. Date: Apr. 8, 2021

(65) Prior Publication Data
US 2022/0231638 A1    Jul. 21, 2022

(51) Int. Cl.
*H03F 3/68* (2006.01)
*H03F 1/02* (2006.01)
(Continued)

(52) U.S. Cl.
CPC ............ *H03F 1/0288* (2013.01); *H03F 1/56* (2013.01); *H03F 3/602* (2013.01); *H03F 2200/255* (2013.01); *H03F 2200/423* (2013.01)

(58) Field of Classification Search
CPC .......... H03F 1/0288; H03F 1/56; H03F 3/602; H03F 2200/255; H03F 2200/423;
(Continued)

(56) References Cited

U.S. PATENT DOCUMENTS 9,496,837 B2 *  11/2016  Qureshi .................... H03F 1/56
10,069,461 B2 *  9/2018  Yamamoto ............... H03F 1/56
(Continued)

FOREIGN PATENT DOCUMENTS

JP    2007-043305 A    2/2007
JP    2010-530148 A    9/2010
(Continued)

OTHER PUBLICATIONS

International Search Report issued in PCT/JP2019/038906; mailed Dec. 24, 2019.
(Continued)

*Primary Examiner* — Khanh V Nguyen
(74) *Attorney, Agent, or Firm* — Studebaker & Brackett PC

(57) ABSTRACT

A Doherty amplifier according to the disclosure includes an input terminal, a first input transmission line connected to the input terminal via a branch portion, a second input transmission line connected to the input terminal via the branch portion, a carrier amplifier connected to the first input transmission line, a peak amplifier connected to the second input transmission line, a first output transmission line including one end connected to output of the carrier amplifier, a second output transmission line including one end connected to output of the peak amplifier, a synthesis line including one end connected to another end of the first output transmission line and another end of the second output transmission line and an output terminal connected to another end of the synthesis line, wherein the first output transmission line includes a wide portion which is wider than another portion of the first output transmission line.

5 Claims, 3 Drawing Sheets

(51) Int. Cl.
*H03F 1/56* (2006.01)
*H03F 3/60* (2006.01)

(58) Field of Classification Search
CPC . H03F 3/189; H03F 3/211; H03F 3/68; H03F 3/195
USPC .............................................. 330/124 R, 295
See application file for complete search history.

(56) References Cited

U.S. PATENT DOCUMENTS

| | | |
|---|---|---|
| 2012/0223775 A1 | 9/2012 | Kim et al. |
| 2014/0097903 A1 | 4/2014 | Aoki et al. |
| 2015/0091651 A1 | 4/2015 | Seneviratne et al. |
| 2016/0344349 A1 | 11/2016 | Shiikuma |
| 2017/0163220 A1 | 6/2017 | Yamamoto et al. |
| 2019/0173430 A1 | 6/2019 | Krehbiel et al. |

FOREIGN PATENT DOCUMENTS

| | | |
|---|---|---|
| JP | 2014-075717 A | 4/2014 |
| JP | WO2015/114698 A1 | 3/2017 |
| TW | 201937845 A | 9/2019 |
| WO | 2016/098223 A1 | 6/2016 |

OTHER PUBLICATIONS

An Office Action issued by Taiwanese Patent Office on Sep. 16, 2020, which corresponds to Taiwanese Patent Application No. 109112152 with partial English language translation.

Kim et al., U.S. Appl. No. 60/925,577, filed Apr. 23, 2007, which corresponds to JP 2010-530148 A.

An Office Action mailed by the Korean Intellectual Property Office on Apr. 12, 2024, which corresponds to Korean Patent Application No. 10-2022-7009265 and is related to U.S. Appl. No. 17/595,556; with English language translation.

\* cited by examiner

DOHERTY AMPLIFIER

FIELD

The present invention relates to a Doherty amplifier.

BACKGROUND

PTL 1 discloses a Doherty amplifier including a first amplifier and one or more second amplifiers and a third amplifier to which high frequency signals are input in parallel. The first amplifier amplifies high frequency signals as a carrier amplifier. Each of the second amplifiers amplifies high frequency signals as a carrier amplifier or a peak amplifier. The third amplifier amplifies high frequency signals as a peak amplifier. In PTL 1, power at a local maximum point of amplification efficiency can be changed by changing a ratio of a sum of device sizes of carrier amplifiers and a sum of device sizes of peak amplifiers.

CITATION LIST

Patent Literature

[PTL 1] JP 2014-075717 A

SUMMARY

Technical Problem

In PTL 1, it is necessary to provide in advance a second amplifier and a switch unit which switches each of the second amplifiers between a carrier amplifier and a peak amplifier to change a frequency band in which high power efficiency can be obtained. Thus, there is a possibility that a size of a device may become larger.

Further, it is also possible to change a frequency band by adjusting an impedance transformation ratio of a carrier amplifier. In this case, there is a possibility that adjustment accuracy of output impedance of the carrier amplifier may be restricted by processing accuracy of a width of an output transmission line. There is therefore a possibility that an optimal impedance transformation ratio cannot be achieved.

The present invention has been made to solve the above-described problem, and an object of the present invention is to obtain a Doherty amplifier which is capable of adjusting a frequency band in which high power efficiency can be obtained with high accuracy.

Solution to Problem

A Doherty amplifier according to the invention of the present application includes an input terminal, an input transmission line including one end connected to the input terminal and another end at which a branch portion is provided, a first input transmission line including one end connected to the branch portion, a second input transmission line including one end connected to the branch portion, a carrier amplifier input of which is connected to another end of the first input transmission line, a peak amplifier input of which is connected to another end of the second input transmission line, a first output transmission line including one end connected to output of the carrier amplifier, a second output transmission line including one end connected to output of the peak amplifier, a synthesis line including one end connected to another end of the first output transmission line and another end of the second output transmission line and an output terminal connected to another end of the synthesis line, wherein the first output transmission line includes a wide portion which is wider than another portion of the first output transmission line.

Advantageous Effects of Invention

In a Doherty amplifier according to the present invention, a first output transmission line includes a wide portion. By adjusting a width of only part of the first output transmission line to adjust output impedance of a carrier amplifier, an adjustment range becomes larger than an adjustment range in a case where a width of the whole first output transmission line is adjusted. This enables high-accuracy adjustment of output impedance. It is therefore possible to adjust a frequency band in which high power efficiency can be obtained with high accuracy by adjusting an impedance transformation ratio with high accuracy.

DESCRIPTION OF EMBODIMENTS

Figure 1:
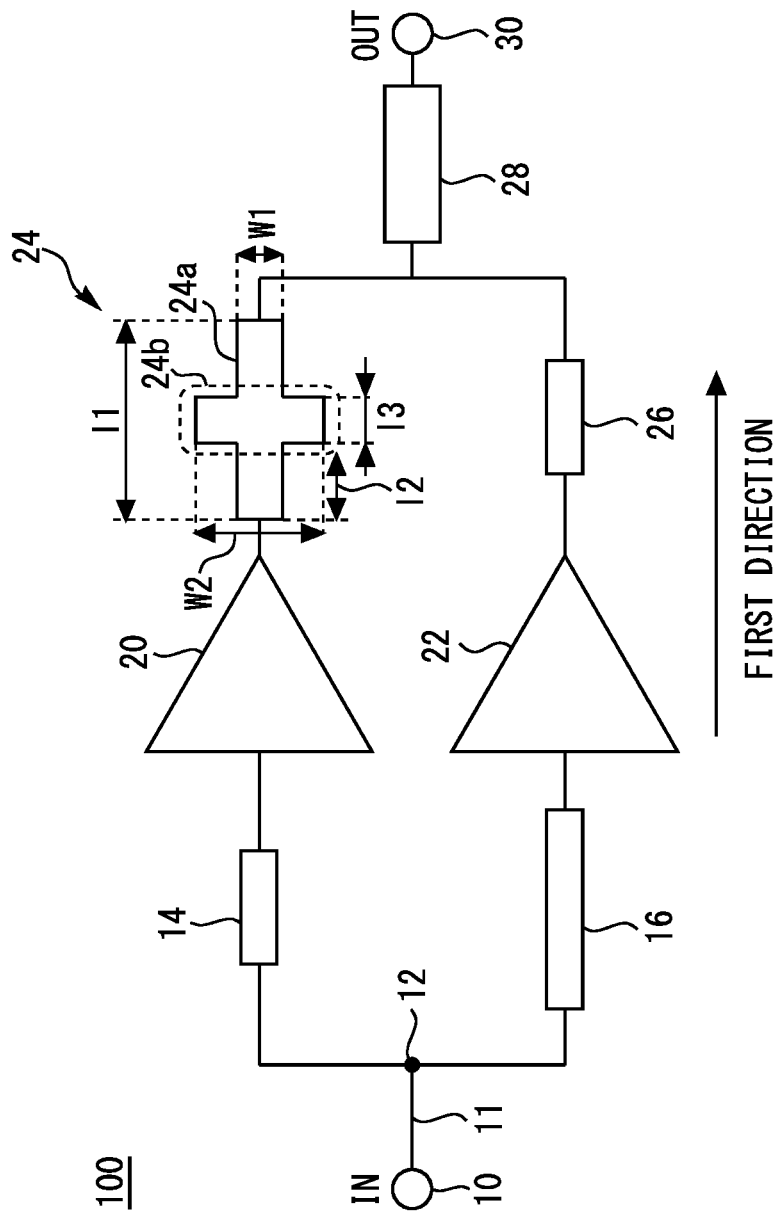
FIG. 1 is a view explaining a configuration of a Doherty amplifier according to a first embodiment.

Doherty amplifiers according to embodiments of the present invention are described with reference to drawings. Identical or corresponding constitutional elements are given the same reference numerals, and the repeated description of such constitutional elements may be omitted.

First Embodiment

FIG. 1 is a view explaining a configuration of a Doherty amplifier 100 according to a first embodiment. The Doherty amplifier 100 is a high-frequency semiconductor device. The Doherty amplifier 100 includes an input terminal 10. One end of an input transmission line 11 is connected to the input terminal 10. A branch portion 12 is provided at the other end of the input transmission line 11. One end of a first input transmission line 14 and one end of a second input transmission line 16 are connected to the branch portion 12.

The branch portion 12 divides an input signal from the input terminal 10. The input signal is a radio frequency (RF) signal. The input signal is divided to the first input transmission line 14 and the second input transmission line 16 at a power ratio of a:b at the branch portion 12. For example, a Wilkinson divider is provided at the branch portion 12. The Wilkinson divider is constituted with two λ/4 transmission lines. In a case of equal division of a=b, each of the two λ/4 transmission lines is, for example, 70.7Ω. The two λ/4 transmission lines are connected to each other with an isolation resistor. The isolation resistor is, for example, 100Ω.

Input of a carrier amplifier 20 is connected to the other end of the first input transmission line 14. Input of a peak amplifier 22 is connected to the other end of the second input transmission line 16. The carrier amplifier 20 operates in all output areas. The peak amplifier 22 does not operate in a back-off area and operates only in an area in which power of an input signal is large. The peak amplifier 22 operates only in an area from a medium output area to a saturation power area in which the carrier amplifier 20 reaches saturation operation.

Each of the carrier amplifier 20 and the peak amplifier 22 includes a transistor chip. Each of the carrier amplifier 20 and the peak amplifier 22 is constituted with 10 cells. A device size of the carrier amplifier 20 is equal to a device size of the peak amplifier 22. The device size corresponds to, for example, the number of gates or a gate width of a transistor. For example, a magnitude of a current which can be applied by the device is determined by the device size. The number of cells of the carrier amplifier 20 may be equal to or different from the number of cells of the peak amplifier 22.

The transistor chip includes, for example, an SiC substrate and GaN provided on the SiC substrate. The carrier amplifier 20 and the peak amplifier 22 are, for example, GaN-HEMT.

One end of a first output transmission line 24 is connected to output of the carrier amplifier 20. One end of a second output transmission line 26 is connected to output of the peak amplifier 22. The other end of the first output transmission line 24 and the other end of the second output transmission line 26 are connected to one end of a synthesis line 28. The other end of the synthesis line 28 is connected to an output terminal 30.

An electrical length of the first input transmission line 14 is different from an electrical length of the second input transmission line 16 by λ/4. The first input transmission line 14 and the second input transmission line 16 are transmission lines for adjusting a phase of an input signal. In the present embodiment, the electrical length of the second input transmission line 16 is longer than the electrical length of the first input transmission line 14 by λ/4.

An electrical length of the first output transmission line 24 is different from an electrical length of the second output transmission line 26 by λ/4. The first output transmission line 24 and the second output transmission line 26 are transmission lines for adjusting phases of output signals from the carrier amplifier 20 and the peak amplifier 22. The electrical length of the first output transmission line 24 is longer than the electrical length of the second output transmission line 26 by λ/4. This phase difference is provided so as to prevent the peak amplifier 22 from being activated in a back-off area. In contrast, the electrical length of the second input transmission line 16 is longer than the electrical length of the first input transmission line 14 by λ/4. This makes an output signal from the first output transmission line 24 in phase with an output signal from the second output transmission line 26.

The configuration is not limited to this, and the electrical length of the first input transmission line 14 may be longer than the electrical length of the second input transmission line 16 by λ/4, and the electrical length of the second output transmission line 26 may be longer than the electrical length of the first output transmission line 24 by λ/4.

Each of the first input transmission line 14, the second input transmission line 16, the first output transmission line 24, the second output transmission line 26 and the synthesis line 28 is, for example, a microstrip line. The first input transmission line 14, the second input transmission line 16 and the second output transmission line 26 have characteristic impedance determined in advance. The first input transmission line 14, the second input transmission line 16 and the second output transmission line 26 are transmission lines having uniform widths. Line widths of the first input transmission line 14, the second input transmission line 16 and the second output transmission line 26 are, for example, 1.05 mm.

The first output transmission line 24 has a cross shape in planar view. The first output transmission line 24 includes a linear main portion 24a. The main portion 24a has a uniform width. The main portion 24a has a width w1 of 1.05 mm and a length l1 of 17.00 mm. The main portion 24a extends in a first direction toward the output terminal 30 from the input terminal 10. The first direction is a signal waveguide direction at the first output transmission line 24.

Further, the first output transmission line 24 includes convex portions which project from the main portion 24a. The convex portions project from both sides of the main portion 24a. Thus, the first output transmission line 24 has a wide portion 24b which is wider than other portions of the first output transmission line 24. The wide portion 24b is formed with the convex portions and a portion adjacent to the convex portions among the main portion 24a. In other words, the wide portion 24b is formed with the convex portions and a portion put between the convex portions among the main portion 24a.

The wide portion 24b is locally formed at the first output transmission line 24. A width w2 of the wide portion 24b is 2.10 mm. The width w2 is a width in a direction which is parallel to a mounting surface on which the transistor chip is mounted and which is perpendicular to the first direction. A length l3 in the first direction of the wide portion 24b is 2.00 mm. Further, a distance l2 from a line end of the first output transmission line 24 to the wide portion 24b is 7.50 mm.

The above-described line lengths and widths are set in accordance with a case where a center frequency is set at 2.6 GHz. The above-described dimension is an example, and other values may be set.

Functions of the Doherty amplifier 100 will be described next. The RF signal input from the input terminal 10 is divided at the branch portion 12 and input to the carrier amplifier 20 and the peak amplifier 22 via the first input transmission line 14 and the second input transmission line 16. The RF signals are amplified at the carrier amplifier 20 and the peak amplifier 22 and synthesized at the synthesis line 28 via the first output transmission line 24 and the second output transmission line 26. The synthesized RF signal is output to outside from the output terminal 30.

The Doherty amplifier 100 is used as, for example, a transmission amplifier for a mobile phone base station. Typically, at the transmission amplifier for the mobile phone base station, a modulation signal with large amplitude fluctuation is used to achieve high-speed data communication. According to the Doherty amplifier 100, it is possible to obtain high power efficiency also in a back-off area.

Typically, a transistor to be used as an amplifier with large output such as a Doherty amplifier has low output impedance. Thus, at the Doherty amplifier 100, impedance is transformed by a matching circuit and a phase adjustment line. By this means, output impedance is converted into 50Ω which matches external load such as an antenna.

At the Doherty amplifier, a carrier amplifier and a peak amplifier which perform different operation are caused to operate in an integrated manner. Thus, an impedance transformation ratio of the carrier amplifier is optimally set in accordance with purpose such as maximization of output or efficiency typically in view of an operation state.

Further, there is a case where it is required that transmission amplifiers for next-generation base stations achieve multi-carrier. Thus, as well as efficiency in a back-off area, a frequency band in which high power efficiency can be obtained is often set as one of important performance indexes. Here, typically, a frequency band of the Doherty amplifier depends on output impedance in a back-off area of the carrier amplifier. It is therefore important to adjust output impedance of the carrier amplifier 20 with high accuracy to achieve a high-functionality Doherty amplifier.

Further, there is typically trade-off relationship between efficiency of the Doherty amplifier and a frequency band. In other words, by setting a smaller impedance transformation ratio of the carrier amplifier, while wider-band characteristics can be achieved, efficiency becomes lower.

The output impedance of the carrier amplifier can be adjusted typically by adjusting a width of an output transmission line. Here, a case will be considered where a small impedance transformation ratio of the carrier amplifier is set to expand a frequency band. In this event, it is conceivable to uniformly increase the width of the output transmission line of the carrier amplifier. However, it may be necessary to process the width of the line in a fine range to cause appropriate impedance transformation at the line with a uniform width. This may make processing difficult and may inhibit obtainment of optimal output impedance. Further, in a case where the output impedance is not set with high accuracy, there is a possibility that the impedance transformation ratio may become lower than necessary and efficiency may largely degrade.

Figure 2:
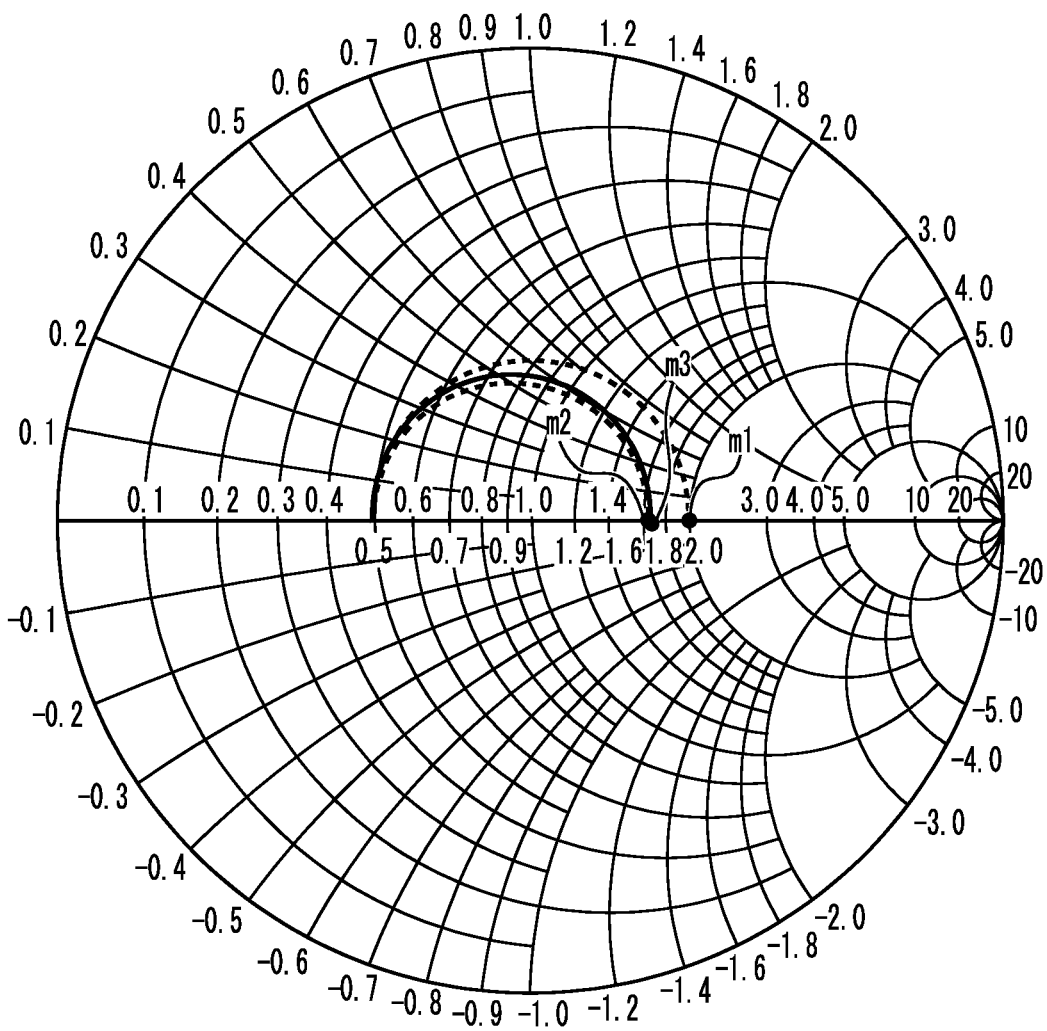
FIG. 2 is a view illustrating a calculation result of impedance according to the first embodiment.

FIG. 2 is a view illustrating a calculation result of impedance according to the first embodiment. FIG. 2 indicates a calculation result of impedance when the output transmission line is viewed from the carrier amplifier in a case where shapes of the output transmission line of the carrier amplifier are m1 to m3. Further, in calculation, from the synthesis line 28 to the output terminal 30 is regarded as being equivalent to an ideal 25Ω terminal. Further, FIG. 2 indicates an impedance at 2.6 GHz. Further, as each transmission line, a microstrip line having a substrate thickness of 0.508 mm, a relative permittivity of 3.72, a conductor thickness of 43 μm and a dielectric tangent of 0.007 is used.

In m1, the output transmission line has a uniform width of 1.05 mm and has a length of 17.00 mm. In m2, the output transmission line has a uniform width of 1.2 mm. In m2, the output transmission line is wider than the output transmission line in m1 by 0.15 mm. m3 corresponds to a shape of the first output transmission line 24 in the present embodiment. In m3, the output transmission line has a local wide portion having a length of 2.00 mm. A width of the wide portion is 2.10 mm, and a distance from a line end to the wide portion is 7.50 mm. An impedance in m2 is equal to impedance in m3.

It has been confirmed from calculation that, to cause impedance transformation at a line having a shape like m1 having a uniform width of 1.05 mm, the width is required to be set at 1.20 mm as in m2. In other words, the width of the line is required to be uniformly increased by 0.15 mm. This requires processing of the width of the line in a fine range. Typically, it is close to impossible to manually process the width of the line in such a fine range in terms of processing accuracy of the transmission line.

In contrast, in m3, impedance transformation similar to impedance transformation in m2 can be achieved by locally increasing the width of the output transmission line. In m3, as compared with a case of m2, an amount of decrease of the impedance transformation ratio with respect to an amount of increase in the width is smaller. In m3, it is only necessary to increase the width of a portion having a length of 2.00 mm among the output transmission line by 1.05 mm compared with the other portions. Such processing typically does not cause any problem in terms of processing accuracy of the transmission line.

In this manner, the wide portion 24*b* of the first output transmission line 24 has a width such that the impedance transformation ratio of the carrier amplifier 20 matches a target value. Here, the impedance transformation ratio is a ratio of the output impedance of the carrier amplifier 20 with respect to the output impedance of the Doherty amplifier 100. The impedance transformation ratio may be a value obtained by standardizing the output impedance of the carrier amplifier 20 by impedance which is a reference. The impedance transformation ratio in the present embodiment is a value obtained by standardizing the output impedance of the carrier amplifier 20 by 50Ω which is the output impedance of the Doherty amplifier 100.

In the present embodiment, an adjustment range can be made larger than an adjustment range in a case where a width of the whole output transmission line is adjusted. This makes processing easier, so that it is possible to adjust the output impedance with high accuracy. It is therefore possible to adjust a frequency band in which high power efficiency can be obtained with high accuracy by adjusting the impedance transformation ratio with high accuracy. Further, it is possible to prevent efficiency from becoming lower than expected.

Further, the wide portions 24*b* are locally provided. Thus, by providing convex portions at the main portion 24*a* with a golden ribbon, or the like, the wide portions 24*b* can be easily formed. This allows the length l3, the width w2 and the position of the wide portion 24*b* to be easily adjusted. Further, for example, the frequency band can be easily adjusted also in a case where a frequency band of the Doherty amplifier 100 which is experimentally manufactured is narrower than a target value.

Further, it is conceivable to increase an output ratio Pc/Pp of the carrier amplifier and the peak amplifier by changing a device size ratio to decrease the impedance transformation ratio. In this case, it is necessary to change a device configuration, which may make adjustment cumbersome. In contrast, in the present embodiment, it is not necessary to change a device configuration and it is possible to easily adjust the impedance transformation ratio. Further, the impedance transformation ratio can be adjusted only by changing the shape of the first output transmission line 24, so that it is possible to prevent increase in the size of the Doherty amplifier 100.

As a modified example of the present embodiment, the convex portion may project from one side of the main portion 24*a*. In this case, a size of the convex portion becomes larger than the size in a case where the convex portions project from both sides of the main portion 24*a*. This can further facilitate processing.

Further, the wide portion 24*b* extends in a direction perpendicular to the first direction. The direction in which the wide portion 24*b* extends is not limited to this, and the wide portion 24*b* only requires to extend in a direction intersecting the first direction. Further, a plurality of wide portions 24*b* may be provided at the first output transmission line 24.

Further, a hybrid coupler may be provided at the branch portion 12. In this event, a passing phase between the branch portion 12 and the first input transmission line 14 is smaller than a passing phase between the branch portion 12 and the second input transmission line 16 by, for example, 90°. In this case, the electrical length of the first input transmission line 14 may be equal to the electrical length of the second input transmission line 16, and the electrical length of the first output transmission line 24 may be longer than the electrical length of the second output transmission line 26 by λ/4.

Further, the passing phase between the branch portion 12 and the first input transmission line 14 may be greater than the passing phase between the branch portion 12 and the second input transmission line 16 by 90°. In this case, the electrical length of the first input transmission line 14 may be equal to the electrical length of the second input transmission line 16, and the electrical length of the second output transmission line 26 may be longer than the electrical length of the first output transmission line 24 by λ/4.

These modifications can be applied, as appropriate, to a Doherty amplifier according to the following embodiment. Note that the Doherty amplifier according to the following embodiment is similar to that of the first embodiment in many respects, and thus differences between the Doherty amplifier according to the following embodiment and that of the first embodiment will be mainly described below.

Second Embodiment

Figure 3:
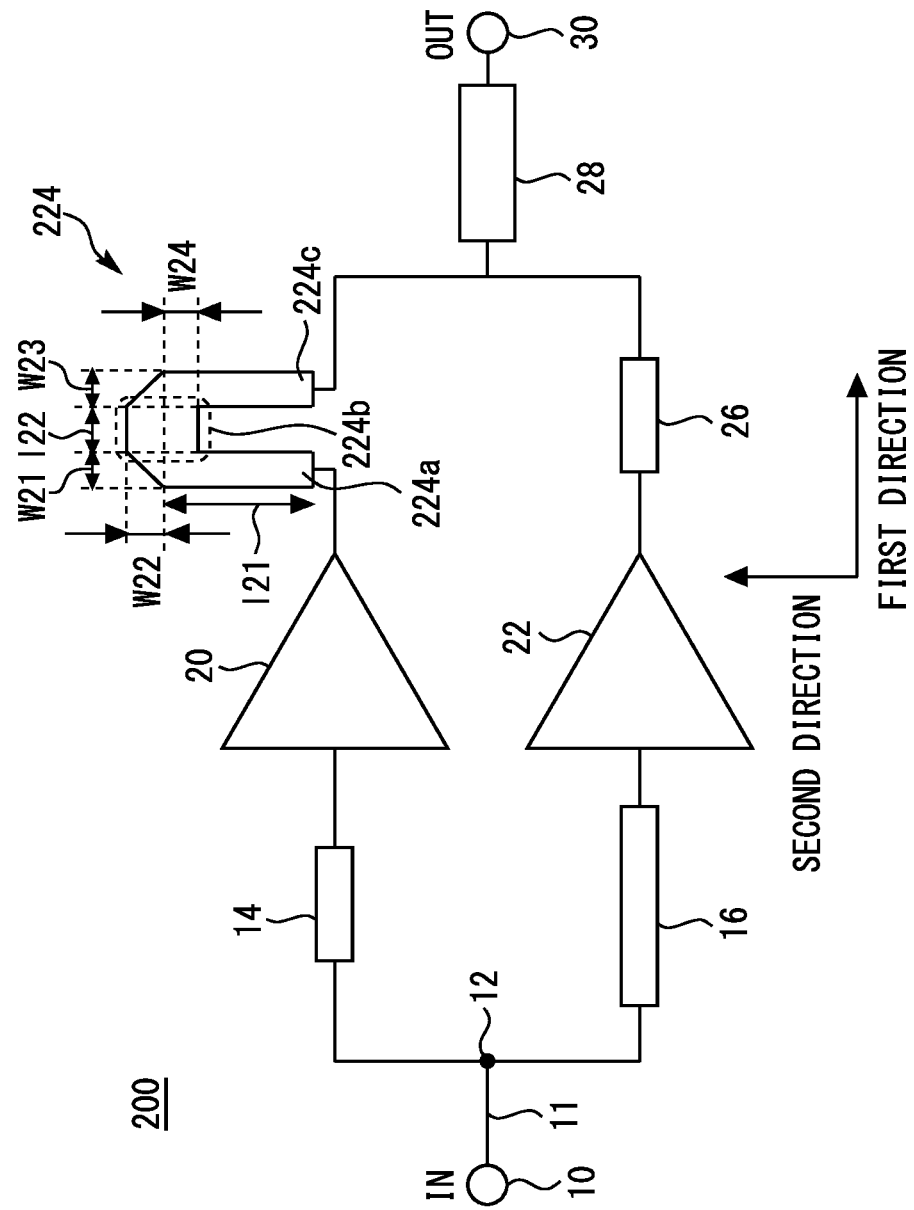
FIG. 3 is a view explaining a configuration of a Doherty amplifier according to a second embodiment.

FIG. 3 is a view explaining a configuration of a Doherty amplifier 200 according to a second embodiment. The Doherty amplifier 200 is different from the Doherty amplifier in the first embodiment in a shape of a first output transmission line 224. Other configurations are the same as the configurations in the first embodiment.

The first output transmission line 224 has a U-shape and is bent. The first output transmission line 224 includes a first main portion 224a, a second main portion 224c and a wide portion 224b. The first main portion 224a includes one end connected to output of the carrier amplifier 20 and extends in a second direction. The second direction is a direction which is parallel to a mounting surface on which a transistor chip is mounted and which is perpendicular to the first direction. The second main portion 224c includes one end connected to the synthesis line 28 and extends in the second direction. The wide portion 224b connects the other end of the first main portion 224a and the other end of the second main portion 224c.

A width w21 of the first main portion 224a, a length w22 of a portion whose width changes among the first main portion 224a, a width w23 of the second main portion 224c, and a length l22 of the wide portion 224b are 1.05 mm. Further, a length l21 of a portion having a uniform width among the first main portion 224a is 8.00 mm. A width w24 of a portion put between a portion having a uniform width of the first main portion 224a and a portion having a uniform width of the second main portion 224c among the wide portion 224b is 1.05 mm. A distance from an end of the line to the wide portion 224b is 1.00 mm. Dimensions described above are an example, and the lengths, the widths and the distance may take other values.

A width of the first output transmission line 224 is regarded as being uniform except a portion indicated by the width w24 among the wide portion 224b. Also in the present embodiment, by providing the wide portion 224b by locally increasing the width of the first output transmission line 224, it is possible to achieve impedance transformation. Thus, compared with a case where a width of the whole output transmission line is adjusted, an adjustment range can be increased, so that it is possible to adjust output impedance with high accuracy. It is therefore possible to adjust a frequency band in which high power efficiency can be obtained with high accuracy by adjusting an impedance transformation ratio with high accuracy.

As a modified example of the present embodiment, the second direction in which the first main portion 224a and the second main portion 224c extend does not have to be perpendicular to the first direction. The second direction is only required to be a direction which intersects the first direction. Further, the second main portion 224c may extend in a direction different from a direction in which the first main portion 224a extends. In other words, the second main portion 224c may extend in a third direction which intersects the first direction and the second direction. Further, the first output transmission line 224 may be formed in a U-shape by being bent twice. The configuration is not limited to this, and the first output transmission line 224 may be bent more than once.

Note that the technical features described in the above embodiments may be combined as appropriate.

REFERENCE SIGNS LIST 10 input terminal, 11 input transmission line, 12 branch portion, 14 first input transmission line, 16 second input transmission line, 20 carrier amplifier, 22 peak amplifier. 24 first output transmission line, 24a main portion, 24b wide portion, 26 second output transmission line. 28 synthesis line, 30 output terminal, 100,200 Doherty amplifier, 224 first output transmission line, 224a first main portion, 224b wide portion, 224c second main portion

The invention claimed is:

1. A Doherty amplifier comprising:
an input terminal;
an input transmission line including one end connected to the input terminal and another end at which a branch portion is provided;
a first input transmission line including one end connected to the branch portion;
a second input transmission line including one end connected to the branch portion;
a carrier amplifier, an input of which is connected to another end of the first input transmission line;
a peak amplifier, an input of which is connected to another end of the second input transmission line;
a first output transmission line including one end connected to an output of the carrier amplifier;
a second output transmission line including one end connected to an output of the peak amplifier;
a synthesis line including one end connected to another end of the first output transmission line and another end of the second output transmission line; and
an output terminal connected to another end of the synthesis line,
wherein the first output transmission line includes a wide portion which is wider than another portion of the first output transmission line, and
the wide portion is not connected to a power supply terminal.

2. The Doherty amplifier according to claim 1, wherein the first output transmission line includes a main portion and convex portion projecting from the main portion, and
the wide portion is formed with the convex portion and a portion adjacent to the convex portion among the main portion.

3. The Doherty amplifier according to claim 2, wherein the convex portion is one of a plurality of convex portions that project from the main portion, and the plurality of convex portions project from both sides of the main portion.

4. The Doherty amplifier according to claim 1,
wherein the first output transmission line comprises:
a first main portion including one end connected to the output of the carrier amplifier and extending in a second direction which intersects a first direction from the input terminal toward the output terminal; and
a second main portion including one end connected to the synthesis line and extending in a third direction which intersects the first direction, and
the wide portion connects another end of the first main portion and another end of the second main portion.

5. A Doherty amplifier comprising:
an input terminal;
an input transmission line including one end connected to the input terminal and another end at which a branch portion is provided;
a first input transmission line including one end connected to the branch portion;
a second input transmission line including one end connected to the branch portion;
a carrier amplifier, an input of which is connected to another end of the first input transmission line;
a peak amplifier, an input of which is connected to another end of the second input transmission line;
a first output transmission line including one end connected to an output of the carrier amplifier;
a second output transmission line including one end connected to an output of the peak amplifier;
a synthesis line including one end connected to another end of the first output transmission line and another end of the second output transmission line; and
an output terminal connected to another end of the synthesis line,
wherein the first output transmission line includes a wide portion which is wider than another portion of the first output transmission line, and
the wide portion has a width such that an impedance transformation ratio of the carrier amplifier matches a target value.

* * * * *